United States Patent
Young et al.

(10) Patent No.: US 7,129,783 B2
(45) Date of Patent: Oct. 31, 2006

(54) HYBRID ACTIVE COMBINER AND CIRCULATOR

(75) Inventors: Albert M. Young, Whittier, CA (US); Samuel S. Osofsky, Rancho Palos Verdes, CA (US); Keven S. MacGowan, Rancho Palos Verdes, CA (US); David A. Ksienski, Los Angeles, CA (US)

(73) Assignee: The Aerospace Corporation, El Segundo, CA (US)

( * ) Notice: Subject to any disclaimer, the term of this patent is extended or adjusted under 35 U.S.C. 154(b) by 39 days.

(21) Appl. No.: 10/973,361

(22) Filed: Oct. 25, 2004

(65) Prior Publication Data

US 2006/0087376 A1    Apr. 27, 2006

(51) Int. Cl.
    *H03F 3/60*    (2006.01)
(52) U.S. Cl. ...................................................... 330/286
(58) Field of Classification Search ............... 330/286, 330/295, 302, 124 R; 333/26, 125, 117
    See application file for complete search history.

(56) References Cited

U.S. PATENT DOCUMENTS

| | | | | | |
|---|---|---|---|---|---|
| 4,092,616 | A | * | 5/1978 | Osterwalder | 333/125 |
| 5,012,203 | A | * | 4/1991 | Beyer et al. | 330/286 |
| 5,455,545 | A | * | 10/1995 | Garcia | 333/26 |
| 6,008,694 | A | * | 12/1999 | El-Sharawy | 330/54 |
| 6,597,243 | B1 | * | 7/2003 | Fratti | 330/54 |

* cited by examiner

*Primary Examiner*—Robert Pascal
*Assistant Examiner*—Hieu Nguyen
(74) *Attorney, Agent, or Firm*—Derrick Michael Reid

(57) ABSTRACT

The hybrid active combiner and circulators serves as a coupler and is a three port network that integrates a directional coupler topology with active devices placed in the coupling paths in order to synthesize a low-loss active combiner circuit or a circulator device with minimal insertion losses. The coupler can have multiple stage amplifiers with transconductance values set according the Pascal's triangle for improved performance, and can function as a low cost and low weight transceiver well suited for various communications systems.

7 Claims, 4 Drawing Sheets

THREE-STAGE HYBRID ACTIVE COUPLER

TWO-STAGE HYBRID ACTIVE COUPLER

THREE-STAGE HYBRID ACTIVE COUPLER

FOUR-STAGE HYRID ACTIVE COUPLER

FIVE-STAGE HYBRID ACTIVE COUPLER

TRANSCONDUCTANCE AMPLIFIER

MATCHED TWO-STAGE HYBRID ACTIVE COUPLER

HYBRID ACTIVE COMBINER AND CIRCULATOR

STATEMENT OF GOVERNMENT INTEREST

The invention was made with Government support under contract No. F04701-00-C-0009 by the Department of the Air Force. The Government has certain rights in the invention.

FIELD OF THE INVENTION

The invention relates to the field of electrical couplers including combiners and circulators. More particularly, the present invention relates to active couplers for transceiving electrical signals.

BACKGROUND OF THE INVENTION

Signal combination can be accomplished by means of passive or active combiners. Passive combiners contain no active or nonlinear elements, such as transistors, while active combiners do contain active devices, such as amplifiers, that provide gain. Scattering or S-parameters often describe combiner performance. A four-port combiner has been used to combine signals. Input signals are input into two ports 1 and 4 and are output from the other two ports 2 and 3 depending on the relative phase of the input signals. The paths between the two inputs ports 1 and 4 and paths between the output ports 2 and 3 are isolated with minimal energy transmission between the ports. The operation of a four-port passive combiner can be described by a generic combiner S-parameter matrix.

$$\begin{bmatrix} \alpha & \gamma & \delta & \beta \\ \gamma & \alpha & \beta & \delta \\ \delta & \beta & \alpha & \gamma \\ \beta & \delta & \gamma & \alpha \end{bmatrix}$$

The S-parameters can be described with linear magnitudes and phase, rather than in dB and phase where each of the parameters listed is actually a complex number. The input match parameters α for each of the four ports are usually small in magnitude, on the order of 0.1, indicating a good signal match. The isolation parameters β are also relatively small in magnitude, such as 0.03, indicating a good port isolation. The combining parameters γ and δ can have large or small magnitudes, depending on the specific requirements. In a slightly lossy 50% combiner, for example, γ and δ would each be slightly less than $1/\sqrt{2}$ in magnitude. The S-parameters also contain phase information. A passive reciprocal combiner requires that Sij=Sji, where i is the output port and j is the input port. Also, the passive combiner cannot produce more RF output power than is input to the combiner. Mathematically, this means that the sum of the squares of the magnitudes of any S-parameter column or row must be less than one for a lossy case or equal to one in an ideal case. The power conservation requirement of passive combiners allows for only limited tradeoffs in combining values.

An active combiner has been built using several field-effect transistors (FETs). The combiner is built by using FETs connected as transmission gates. In the FET active combiner, the signal path is from the source to the drain or from the drain to the source through the transistor. Feedback through other FETs and resistors is used to provide the combiner isolation. By constructing a fully active combiner through the use of FETs, the input and output paths are all made to be non-reciprocal. The FET active combiner does not meet the requirements of some applications, such as source-pull measurements, that require reciprocity in at least one of the signal paths.

Source-pull measurements are often conducted to investigate the stability of power amplifiers. A typical source-pull circuit requires a directional coupler having a variable load at port 1, dummy load at port 3, a signal source at port 4, and a device under test (DUT) at port 2. The directional coupler isolates the input signal and the variable load when applied to the port of the device under test. Ideally, the variable load that should be applied to the DUT source should have a reflection coefficient ρ that varies in magnitude from 1 indicating a short or an open condition, to 0 indicating a matched load. Because of power conservation restrictions between ports 1 and 2, the directional coupler exhibits a small but significant insertion loss that then reduces the range of the reflection coefficient ρ that can be applied to the source port of the DUT. For example, an ideal 10 dB coupler would reduce the maximum applied reflection coefficient ρ to 0.81. The path from the variable load to DUT source port must also be reciprocal. However, well-designed DUTs, such as amplifiers, are generally stable for relatively large values of the reflection coefficient ρ. These active circuits would tend to oscillate for extreme values of the reflection coefficient ρ, such as those larger than 0.8. A passive combiner with 20 dB coupling could be used to extend the range of available the reflection coefficient ρ. However, a ten times more powerful signal source is required for the test setup. These larger power signal sources can be relatively expensive.

Circulators have been used to translate signals from one port to another port. The operation of a three-port circulator can be described by a generic circulator S-parameter matrix.

$$\begin{bmatrix} \alpha & \beta & \gamma \\ \gamma & \alpha & \beta \\ \beta & \gamma & \alpha \end{bmatrix}$$

The input match parameters for each port α are relatively small in magnitude. The forward S-parameters S21, S32, and S13 are relatively large in magnitude and less than one, while the reverse S-parameters S12, S23, and S31 are relatively small in magnitude, similar to the isolation parameters β of the combiner. The passive circulator is a non-reciprocal device, modeled by Sij not equal to Sji, that must still satisfy the same power conservation law as does the passive combiner. However, a realistic circulator also has approximately 0.5 dB of insertion loss at γ=0.944 in each of the forward paths.

Circulators are often used at the front end of a transceiver system that contains only one antenna port. Examples of such systems include radar transceivers, cellular phones, and other wireless devices. The circular can have three ports 1, 2, and 3, where a signal can circulate from port 1 to port 2, or from port 2 to port 3, or from port 3 to port 1. In an exemplar configuration, the circulator port 1 is connected to an antenna, a receiver is connected to port 2, and a transmitter is connected to port 3. The circulator allows the transmitted signal to travel, for example, from port 3 to port 1 and then into the antenna. During transmission, the circulator isolates the sensitive receiver attached to port 2 from the large transmitter signal at port 1. This isolation value is on the order of 0.1 units. The received signal is input from the antenna into port 1 and travels through the circulator to port 2. The received signal is thus isolated from the transmitter port 3. The circulator, while performing a needed operation, degrades the signal strength during transmission and reception. The circulator causes a loss in the outgoing signal from the transmitter amplifier. This signal loss reduces the range that the radar can detect objects, or that a wireless device can communicate. Then, on reception, the circulator introduces a loss in the receiver path. Because this receiver loss is placed before the low-noise amplifiers, the loss value adds directly to the noise value of the receiver path, thus degrading the magnitude of the minimal detectable signal.

Circulators also have a certain size and weight that is determined by the frequency of use. When the circulator is used in a space-based phased array application, the total weight of the circulators can be large. Also, a goal of building wireless devices is to reduce the profile of the circuitry and hence the external packaging as much as possible. The design of active circulators and active quasi-circulators are typically large in size. The active circulator designs are rotationally symmetric, while active quasi-circulators are not. The quasi-circulators have only one orientation that can be used in a transceiver application. Typical circulator architectures add a significant amount of noise in addition to the noise introduced by the low noise amplifier that is usually the first element in the receiver path. The best architecture of a quasi-circulator has a 3 dB noise figure. The output powers in some circulator designs are limited by the presence of active devices at the antenna port. The circulator architectures sacrifice both output power and noise figure to achieve as near as possible circulator function. These circulators operate with high noise figures, low output signal levels, are heavy and have large profiles. These and other disadvantages are solved or reduced using the invention.

SUMMARY OF THE INVENTION

An object of the invention is to provide a hybrid active combiner and circulator for communicating signals between three ports.

Another object of the invention is to provide a hybrid active combiner and circulator for communicating signals between three ports with ¼ wavelength delays and active transconductance amplifiers.

Yet another object of the invention is to provide a hybrid active combiner and circulator for communicating signals between two ports with ¼ wavelength delays and active transconductance amplifiers combined as stages.

The present invention is directed to a hybrid active combiner and circulator, referred to herein as a coupler, comprising ¼ wavelength delays and active transconductance amplifiers for communicating a signal between ports with reduced insertion losses. The hybrid active coupler can be built with two or more stages, each stage including one transconductance amplifier, with the amplifiers aligned in parallel. Between adjacent pairs of amplifiers are disposed ¼ wavelength delays. The λ/4 delays serve to provide cancellation between the ports, so that signals are precisely reproduced at connecting ports, with minimal insertion losses. Multiple stages provide for improved efficiency and bandwidth with reduced insertion losses. These and other advantages will become more apparent from the following detailed description of the preferred embodiment.

DETAILED DESCRIPTION OF THE PREFERRED EMBODIMENT

An embodiment of the invention is described with reference to the figures using reference designations as shown in the figures.

Figure 1:
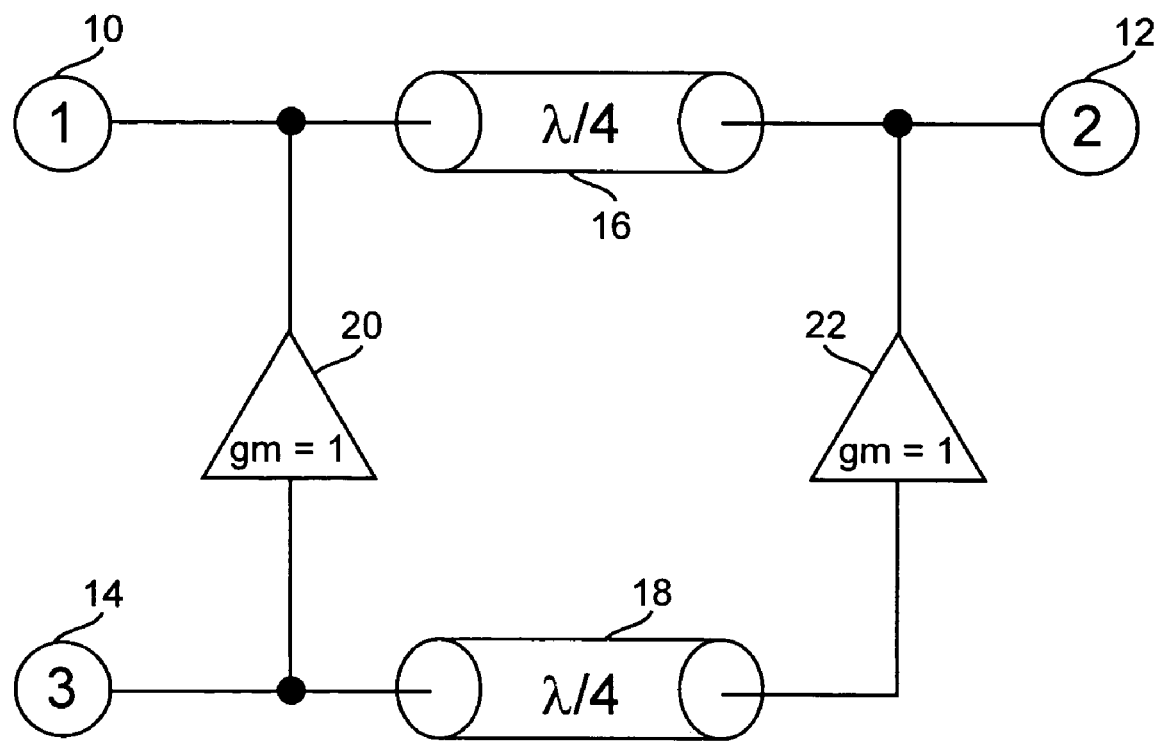
FIG. 1 is a block diagram of a two-stage hybrid active coupler.

Referring to FIG. 1, a hybrid active coupler that functions as a combiner and a circulator, is a three-port network, having a first port 10, a second port 12 and a third port 14. This configuration is a the simplest form of the coupler as a two-stage network having two passive delays 16 and 18 and two transconductance amplifiers 20 and 22 each having a normalized transconductance of unity. Each stage is characterized by an amplifier. The amplifiers 20 and 22 are aligned in parallel, with the delay 16 connected across the outputs and delay 18 connected across the inputs of the amplifiers 20 and 22. An input signal into the third port 14 is connected to first and second ports 10, and 12, respectively, between which is disposed the delay 16. A passive signal path between ports 10 and 12 is designed to have minimal insertion loss. The port 14 is the input to the active amplifier stages of the coupler. A signal entering port 14 is amplified and appears at the second port 12 but is suppressed at first port 10. The directional behavior of the coupling from port 14 to ports 10 and 12 is a useful characteristic of operational communications transceivers.

A three port S-parameter matrix can summarize the coupling and suppressing behavior of the coupler. Again, α the impedance match is small in magnitude as in the nominal combiner and circulator designs. The reciprocal path between ports 10 and 12 is described by δ whose nominal value is designed to be as close to one as possible. The isolation parameter β is again small in magnitude like in the nominal combiner and circulator designs. However, γ in the coupler topology is a design variable. While in the passive combiner, the possible values of δ and γ are coupled together by the power conservation law, the coupler design completely uncouples the possible values of δ and γ. Depending on how the amplifiers are biased and on the specific application, the value of δ could be designed to be less than one, equal to one, or greater than one.

The coupler can be used as a source-pull test set solution. The coupler can be applied to improve the range of high-reflectance loads that can be applied to a device under test (DUT) in a source-pull test set while not requiring excessively powerful source amplifiers. The insertion loss of the coupler is a combination of the loss of the quarter-wave lines and the loading effect of the transistor amplifiers. Because the output impedance of the amplifiers is designed to be large, this loading effect is very small. A simulation of the insertion loss of a two-tap coupler from 4 to 20 GHz indicates that one-way insertion losses of 0.1 dB are achievable when the output impedance of the active devices is greater than 5k Ohms, which is realizable with the cascode design of the transconductance amplifiers. The use of the coupler, in this case, provides a maximum achievable ρ of 0.977. In terms of area of the Smith Chart, the coupler allows an additional 30% of the entire Smith Chart to be applied to the source of a DUT.

The coupler can be used for transceiver transmit and receive front-end solutions. The coupler can significantly improve the performance of any transmit and receive circuit front end that uses a circulator to isolate the transmit and receive operations. These applications include radar front ends and personal wireless devices. The coupler design places the active devices and passive transmission lines in the optimal locations for improved signal levels. Active devices are not in all of the paths of the coupler such as the passive delay 16 between ports 10 and 12. The topology of the coupler optimizes placement of the transmit amplifier transistors for maximum output power, and the placement of the receiver low noise amplifier (LNA) for low-noise performance, thus optimizing the overall transceiver performance. The coupler does not sacrifice output power or performance in order to achieve an ideal circulator topology.

The coupler would reduce the signal degradation caused by the circulator in both transmit and receive operations. For example, the useful range of the radar is proportional to $(P_{trans}/T)^{1/4}$ where $P_{trans}$ is the transmitted power and T is the noise temperature of the receive chain. The coupler improves the range by approximately 5% with all other factors remaining equal. If the range is kept constant, then the minimum detectable signal level improves by approximately 0.8 dB with all other factors remaining equal.

A metric of equivalent circulator performance is given as Pout/(noise figure), where Pout is the output power of the active circulator and the noise figure (NF) is the total noise figure of the circulator and the noise figure of receiver LNA and NFLNA. The best of six architectures delivers Pout-NFLNA-3 dB, whereas the coupler, in an equivalent situation would deliver Pout-NFLNA-L, where L is on the order of 0.2 dB. Thus, the coupler delivers an equal power output with a significantly better conventional NF. If the number of stages on the coupler were increased to 3, the HACC efficiency would improve by 1.75 dB for the same output power, while the NF would degrade by less than 0.1 dB.

Also, the weight and size of a radar array can be reduced. The weight reduction increases as the frequency of the radar decreases. As an example, X-band circulators were found to have an approximate size of 12.7 mm×12.7 mm×6.4 mm and have a mass of approximately 0.015 kg. An integrated circuit form of the HACC could be built on a semiconductor substrate with an approximate size of 10 mm×5 mm×0.1 mm and mass of 0.03e–3 kg. The mass and effect upon launch costs of a 500 transmit and receive element X-band array could be decreased by as much as 7.5 kg. Other radar front ends, such as those for collision avoidance, could be manufactured in a much more planar and compact configuration. Any personal wireless device that uses a circulator in the front end, could replace the relatively large and high profile circulator with a coupler, and thus lessen the profile of the external package.

The coupler is a band pass network with a center frequency at $f_o$, the frequency at which the transmission line sections are a quarter wavelength long. The active part of the network injects ac currents into the nodes at each end of the transmission line sections between ports 10 and 12. The phase of each of these injected currents is adjusted to keep current in quadrature with one another. At each injection point, a signal propagates to the left and to the right. Due to the phase and amplitude relationship between the injected signals, the contributions sum to zero at port 10 and add constructively at port 12. The circuit effectively synthesizes a virtual ground at port 10 with respect to signals introduced at port 14. This simplest form of the coupler has only two injection points, but any number can be used. The injected currents must be supplied by amplifiers designed to have a high output impedance so as to not load the transmission line at the injection points. The larger the number of injection points, the more serious the impact of the amplifier output impedance is on propagation from port 10 to port 12. The input signals to each of the amplifiers must be derived from a network that can produce the proper phase relationships between them.

Figure 2:
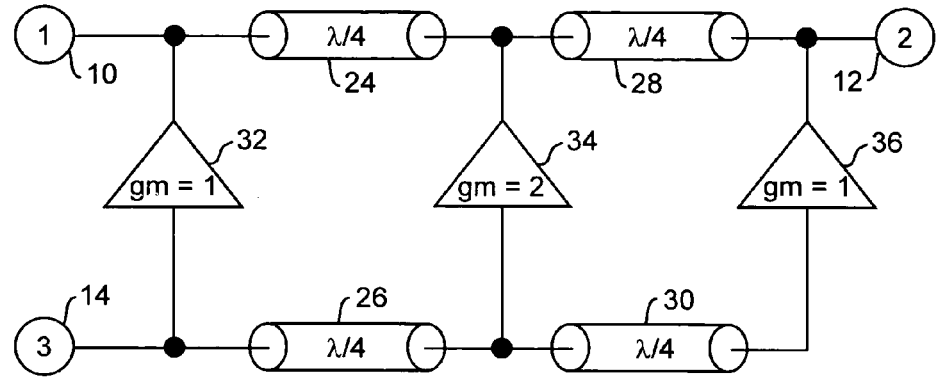
FIG. 2 is a block diagram of a three-stage active coupler.

Referring to FIG. 2, a three-stage hybrid active coupler is shown that has three transconductance amplifiers 32, 34, and 36, and the outer two amplifiers 32 and 36 have transconductance of gm=1 and the center amplifier 34 has a gm=2. Between the amplifiers 32 and 36 are λ/4 delays 24 and 26, and between amplifier 34 and 36 are λ/4 delays 28 and 30. As with the two-stage coupler, the first port 10 is at the output of the first amplifier 32 and the third port 14 is at the input of the first amplifier 32, while the second port 12 is at the output of the third amplifier 36.

Figure 3:
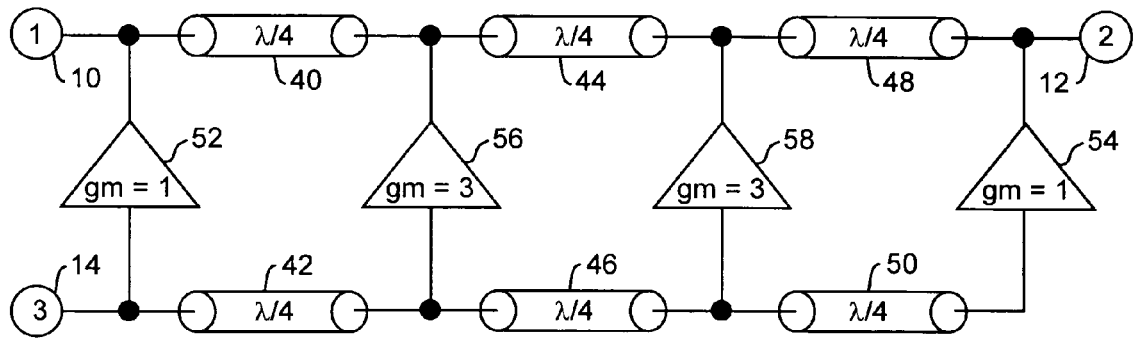
FIG. 3 is a block diagram of a four-stage active coupler.

Referring to FIG. 3, the four-stage hybrid active coupler is shown to have four transconductance amplifiers 52, 54, 56, and 58, the outer two amplifiers 52 and 54 have a transconductance of gm=1 and the two center amplifiers 56 and 58 have a gm=3. Between the amplifiers 52 and 56 are λ/4 delays 40 and 42, between amplifiers 56 and 58 are λ/4 delays 44 and 46, and between amplifiers 58 and 54 are λ/4 delays 48 and 50. As with the two-stage and three-stage couplers, the first port 10 is at the output of the first amplifier 52 and the third port 14 is at the input of the first amplifier 52, while the second port 12 is at the output of the fourth amplifier 54.

Figure 4:
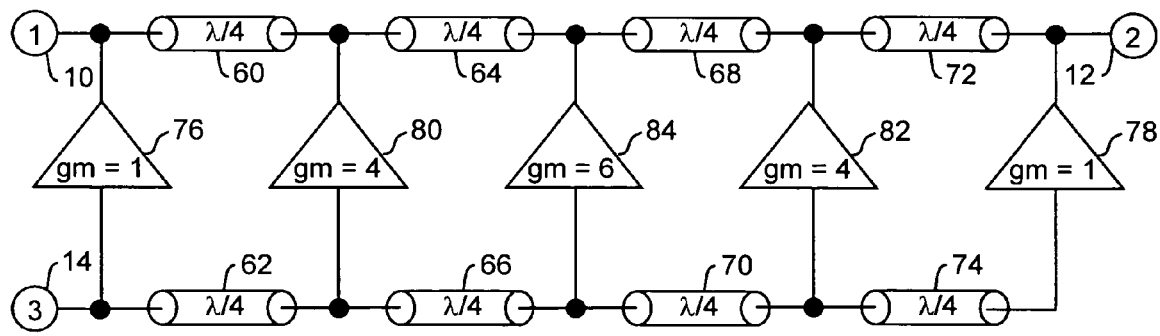
FIG. 4 is a block diagram of a five-stage active coupler.

Referring to FIG. 4, the five-stage hybrid active coupler is shown to have five transconductance amplifiers 76, 78, 80, 82 and 84, the outer two amplifiers 76 and 78 have a transconductance of gm=1, the middle two amplifiers 80 and 82 have a gm=4, and the center amplifier 84 has a gm=6. Between the amplifiers 56 and 80 are λ/4 delays 60 and 62, between amplifiers 80 and 84 are λ/4 delays 64 and 66, between amplifiers 84 and 82 are λ/4 delays 68 and 70, and between amplifiers 82 and 78 are λ/4 delays 72 and 74. Like with the two-stage, three-stage, and four-stage couplers, the first port 10 is at the output of the first amplifier 76 and the third port 14 is at the input of the first amplifier 76, while the second port 12 is at the output of the fourth amplifier 78.

Thus, multistage couplers have different amplifier transconductance gm weights, while the two-stage coupler will have weights of 1-1, the three-stage coupler will have weights 1-2-1, the four-stage coupler will have weights of 1-3-3-1, and, the five stage coupler will have weights of 1-4-6-4-1, and so on. The power delivered from each stage equals $(I_{rms})^2 Z_{node}$ where $I_{rms}$ is the root-mean square value of the ac output current and $Z_{node}$ is the driving point impedance of the node. Because the node at port 1 is a virtual ground ($Z_{node}=0$ Ohms), no power can be delivered to the transmission line from the ac current source at this tap. The maximum efficiency of the amplifiers in the coupler is therefore limited by this mechanism. Considering the two-stage coupler, and assuming that amplifiers are biased linearly, the upper bound on the efficiency would be 25%. For the three-stage coupler, the maximum efficiency would be 37.5%. For the four-tap coupler, the efficiency bound would be 43.75%

Figure 5:
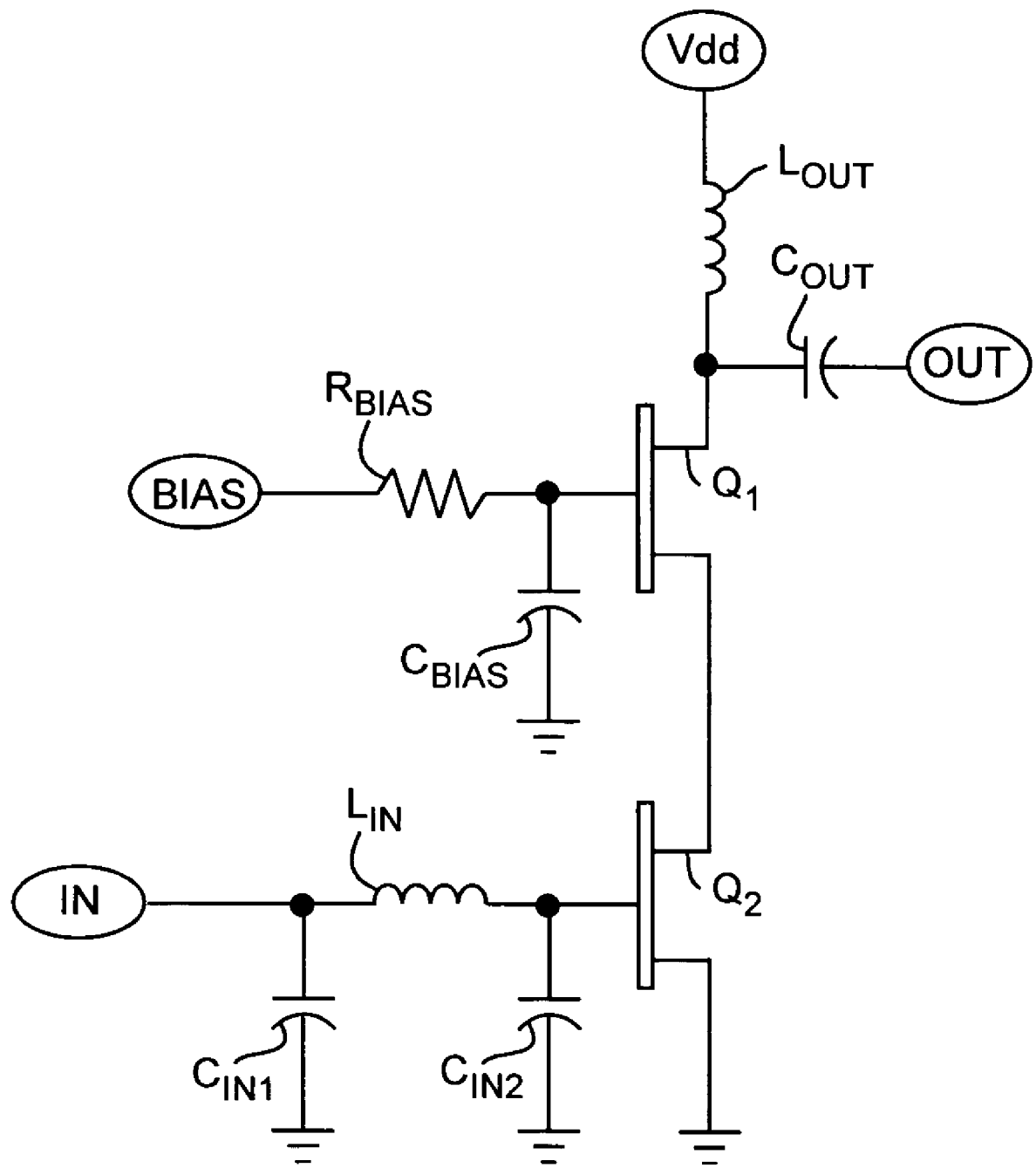
FIG. 5 is a schematic of a transconductance amplifier.

Referring to FIG. 5, the transconductance amplifiers used to inject current into the through transmission paths within the coupler preferably have a very high output impedances.

This is to prevent the amplifiers from absorbing energy or causing reflections on the through path. An exemplary form of the topology of those amplifiers is the cascode pair. Two transistors $Q_1$ and $Q_2$ are connected in series between Vdd power and ground. The top transistor $Q_1$ operated as a grounded gate transistor having bias voltage connected through a $R_{Bias}$ resister with a bias capacitor $C_{Bias}$. This transistor $Q_1$ has a $L_{out}$ inductor connected between the power vdd and the transistor $Q_1$ with an output $C_{out}$ coupling the transistor output node to an amplifier OUT, and serves to isolate the output node from the lower transistor $Q_2$, which produces the gain realized by the amplifier stage. The lower transistor $Q_1$ has an input inductor $L_{IN}$ connected to the input IN, and two matching capacitors $C_{IN1}$ and $C_{IN2}$ connected to ground on each side of the inductor $L_{IN}$. The output of transistor $Q_1$ feeds current into the low input impedance produced by transistor $Q_2$. The grounded base or gate configuration of $Q_2$ produces a low input impedance due to the negative current feedback inherent with this circuit. The overall properties of the cascode amplifier include high output impedance, good input-output isolation, wide bandwidth, and lower efficiency than a single stage amplifier having only one transistor.

Figure 6:
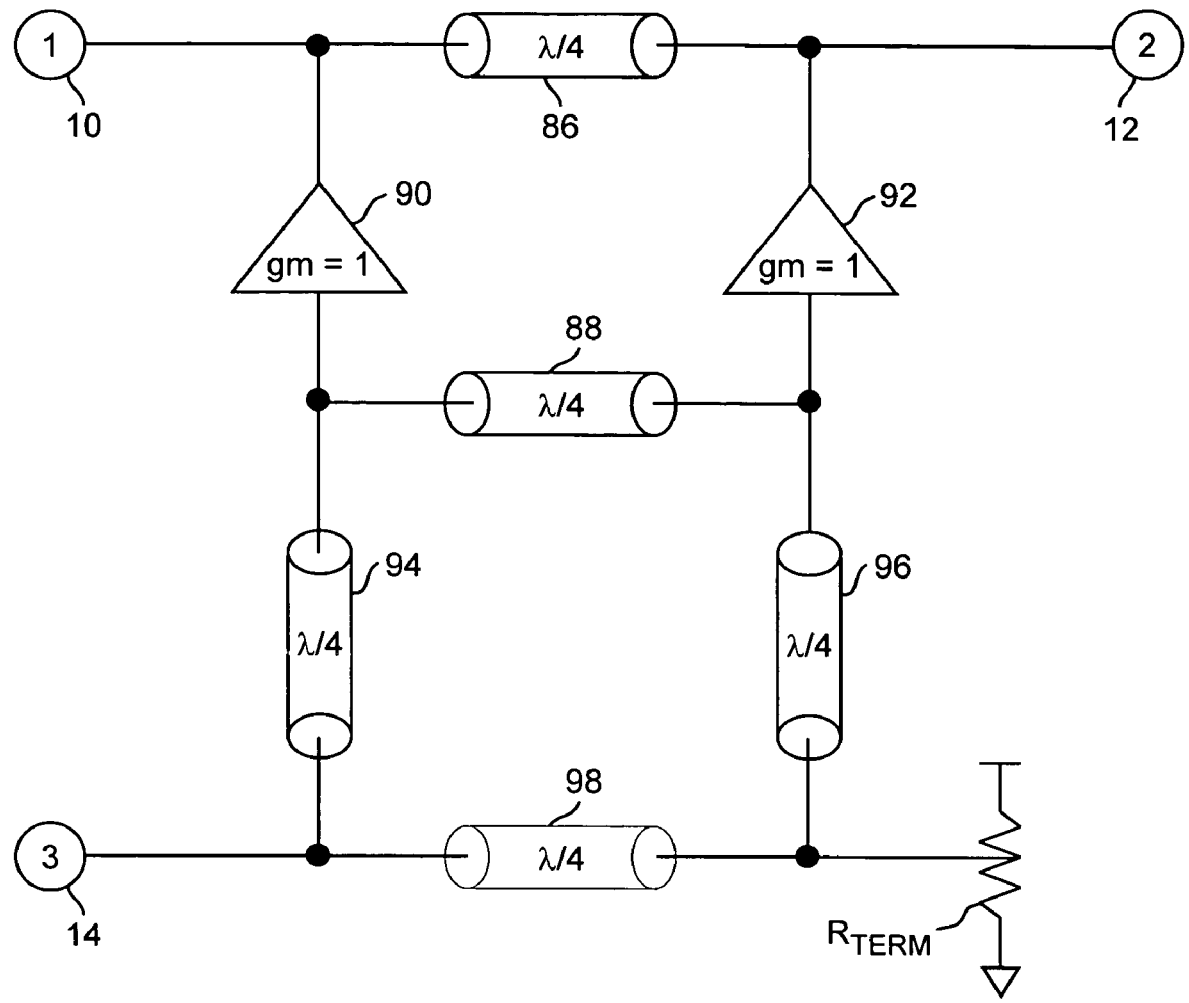
FIG. 6 is a schematic of a matched two-stage hybrid active coupler.

Referring to FIG. 6, the multistage coupler can be used in other configurations as well, including a matched two-stage hybrid active coupler. Two transconductance amplifiers 90 and 92 have respective outputs respectively connected to the first port 10 and the second port 12. Between the two amplifiers 90 and 92 are λ/4 delays 86 and 88. The third port 14 is connected to λ/4 delays 94 and 98. Delay 98 is connected to a terminating resistor $R_{Term}$ and a λ/4 delay 96. The delays 94 and 96 are respectively connected to the two amplifiers 90 and 92 and across the delay 88. For the matched two-stage coupler, the two amplifier input signals are derived from a quadrature hybrid which places them 90 degrees out of phase with respect to each other, and allows the amplifiers 90 and 92 to terminate each leg of the hybrid for matched termination operation.

The ideal amplifiers 20 and 22 of FIG. 1 have an infinite input impedance. The delay 18 of FIG. 1 indicates that the signal at the input to amplifier 22 is rotated by 90 degrees relative to the amplifier 20 without regard to the loading produced by the amplifiers 20 and 22. FIG. 6 provides the topology of a two stage coupler in which the amplifiers 90 and 92 have realistic input impedances equal to the impedances of the delays 88, 94, 96, and 98, which may be transmission lines, and equal to the impedance of $R_{TERM}$. Hence, delays 88, 94, 96, and 98 form a branch line coupler that drives the amplifiers 90 and 92 with real impedances, so that a practical design can be realized.

The present invention is directed to multistage active hybrid couplers for use as circulator and combiners while providing improved linearity, with low power, and small size that can be realized on monolithic integrated semiconductor substrates. Various numbers of stages can be used having a Pascal's triangle relationship between the transconductance of the amplifiers of each stage. The use of different amplifier transconductance weight could allow the synthesis of Chebyshev, Butterworth, or other such weighted combinations. Additional stages can be used for matched termination operation. Those skilled in the art can make enhancements, improvements, and modifications to the invention, and these enhancements, improvements, and modifications may nonetheless fall within the spirit and scope of the following claims.

What is claimed is:

1. A coupler for communicating a signal between at least two ports, the coupler comprising,
    a first stage amplifier having an input coupled to a third port,
    a second stage amplifier having an output coupled to a second port,
    a first pair of delays comprising a first delay coupled between outputs of the first and second stage amplifiers, and comprising a second delay coupled between inputs of the first and second stage amplifiers, the first pair of delays providing accumulative signal strength at the second port when the signal is present at the third port,
    a first port at the output of the first stage amplifier, the first and second delays serving to provide cancellation of the signal strength so that signal at the third port is absent at the first port, the first delay providing a transmission path between the second port and the first port for coupling the signal between the second port and the first port, and
    the coupler further comprising, one or more stage amplifiers having respective pairs of delays disposed at outputs and inputs of the amplifiers having transconductances are related to each other by Pascal's triangle.

2. The coupler of claim 1 being a transceiver and further comprising,
    a first port at the output of the first stage amplifier, wherein,
    the first and second delays serve to provide cancellation of the signal strength so that signal at the third port is absent at the first port and present at the second port during transmission of the signal from the third port to the second port, and
    the first delay provides a transmission path between the second port and the first port,
    the first and second stage amplifiers blocking communication of the signal at the second port from being present at the third port, and
    the first delay for coupling the signal at the second port to the first port during reception of the signal from the second port to the first port.

3. The coupler of claim 1 wherein,
    the first and second stage amplifiers have a transconductance equal to one,
    the first and second delays being ¼ wavelength delays equal a ¼ wavelength.

4. The coupler of claim 1 further comprising,
    a third stage amplifier disposed between the first and second stage amplifiers,
    a second pair of delays respectively coupled at an output and an input of the third stage amplifier, wherein
    the first and second stage amplifiers having a transconductance equal to one, and
    the third stage amplifier having a transconductance equal to two.

5. The coupler of claim 1 further comprising
    a third stage amplifier,
    a second pair of delays respectively coupled an output and an input of the third stage amplifier,
    a fourth stage amplifier,
    a third pair of delays respectively coupled at an output and an input of the fourth stage amplifier,
    the third and fourth stage amplifiers disposed between the first and second stage amplifiers, the first and second stage amplifiers having a transconductance equal to one, and the third and fourth stage amplifier having a transconductance equal to three.

6. The coupler of claim 1 further comprising
a third stage amplifier,
a second pair of delays respectively coupled at an output and an input of the third stage amplifier,
a fourth stage amplifier,
a third pair of delays respectively coupled at an output and an input of the fourth stage amplifier,
the third and fourth stage amplifiers disposed between the first and second stage amplifiers,
a fifth stage amplifier disposed between the third and fourth stage amplifiers,
a fourth pair of delays respectively coupled at an output and an input of the fifth stage amplifier,
the first and second stage amplifiers having a transconductance equal to one,
the third and fourth stage amplifier having a transconductance equal to four, and
the fifth stage amplifier having a transconductance equal to six.

7. The coupler of claim 1 being a matched coupler, the second delay comprising,
a terminator,
a first termination delay between the terminator and the third port,
a second terminator delay disposed between the third port and the input of the first stage amplifier,
a third terminator delay disposed between the terminator and the input of the second stage amplifier,
a fourth terminator delay disposed between the inputs of the first and second stage amplifiers, wherein,
the terminator serves to reduce signal reflections at the third port.

* * * * *